(12) United States Patent
Baisl et al.

(10) Patent No.: US 9,831,465 B2
(45) Date of Patent: Nov. 28, 2017

(54) OPTOELECTRONIC COMPONENT AND METHOD FOR PRODUCING SAME

(71) Applicant: OSRAM OLED GmbH, Regensburg (DE)

(72) Inventors: Richard Baisl, Regensburg (DE); Christoph Kefes, Regensburg (DE); Michael Popp, Freising (DE)

(73) Assignee: OSRAM OLED GmbH, Regensburg (DE)

( * ) Notice: Subject to any disclaimer, the term of this patent is extended or adjusted under 35 U.S.C. 154(b) by 72 days.

(21) Appl. No.: 14/901,739

(22) PCT Filed: Jun. 30, 2014

(86) PCT No.: PCT/EP2014/063882
§ 371 (c)(1),
(2) Date: Dec. 29, 2015

(87) PCT Pub. No.: WO2015/000859
PCT Pub. Date: Jan. 8, 2015

(65) Prior Publication Data
US 2016/0372700 A1    Dec. 22, 2016

(30) Foreign Application Priority Data
Jul. 1, 2013 (DE) .................. 10 2013 106 855

(51) Int. Cl.
*H01L 51/52* (2006.01)
*H01L 51/44* (2006.01)
*H01L 51/56* (2006.01)

(52) U.S. Cl.
CPC ........ *H01L 51/5246* (2013.01); *H01L 51/448* (2013.01); *H01L 51/5253* (2013.01);
(Continued)

(58) Field of Classification Search
CPC . H01L 51/5243; H01L 51/56; H01L 51/5253; H01L 2251/301
See application file for complete search history.

(56) References Cited

U.S. PATENT DOCUMENTS 3,141,238 A    7/1964  Harman
3,335,489 A    8/1967  Grant
(Continued)

FOREIGN PATENT DOCUMENTS

DE    19532251 A1    3/1997
DE    10219951 A1    11/2003
(Continued)

OTHER PUBLICATIONS

German Office Action based on Application No. 10 2013 106 855.3 (6 pages) dated Mar. 10, 2017.
(Continued)

*Primary Examiner* — Moazzam Hossain
*Assistant Examiner* — Hajar Kolahdouzan
(74) *Attorney, Agent, or Firm* — Viering, Jentschura & Partner mbB

(57) ABSTRACT

A method for producing an optoelectronic component may include forming an optoelectronic layer structure having a first adhesion layer, which comprises a first metallic material, above a carrier, providing a covering body with a second adhesion layer, which comprises a second metallic material, applying a first alloy to one of the two adhesion layers, the melting point of the first alloy being so low that the first alloy is liquid, coupling the covering body to the optoelectronic layer structure in such a way that both adhesion layers are in direct contact with the liquid first alloy, and reacting at least part of the liquid first alloy chemically with the metallic materials, as a result of which at least one second alloy is formed, which has a higher
(Continued)

melting point than the first alloy, wherein the second alloy solidifies and fixedly connects the covering body to the optoelectronic layer structure.

18 Claims, 5 Drawing Sheets

(52) U.S. Cl.
CPC ......... *H01L 51/5259* (2013.01); *H01L 51/56* (2013.01); *H01L 51/5203* (2013.01); *H01L 51/5212* (2013.01); *H01L 51/5243* (2013.01); *H01L 51/5256* (2013.01); *Y02E 10/549* (2013.01); *Y02P 70/521* (2015.11)

(56) References Cited

U.S. PATENT DOCUMENTS

| | | | |
|---|---|---|---|
| 5,043,139 | A | 8/1991 | Carnall, Jr. et al. |
| 5,053,195 | A | 10/1991 | MacKay |
| 5,653,856 | A | 8/1997 | Ivanov et al. |
| 6,160,346 | A | 12/2000 | Vleggaar et al. |
| 2002/0068143 | A1* | 6/2002 | Silvernail ............... B32B 3/00 428/76 |
| 2003/0019572 | A1 | 1/2003 | Low et al. |
| 2003/0215981 | A1* | 11/2003 | Strouse ............... B23K 35/26 438/118 |
| 2003/0222061 | A1 | 12/2003 | Langer et al. |
| 2006/0226419 | A1 | 10/2006 | Bimstock et al. |
| 2009/0302760 | A1 | 12/2009 | Tchakarov et al. |

FOREIGN PATENT DOCUMENTS

| | | |
|---|---|---|
| DE | 102007046730 A1 | 4/2009 |
| EP | 0842592 B1 | 10/2001 |
| EP | 1894263 B1 | 6/2011 |
| WO | 2004066409 A1 | 8/2004 |

OTHER PUBLICATIONS

International Search Report based on application No. PCT/EP2014/063882 (4 pages and 3 Pages of English translation) dated Sep. 30, 2014.
German Search Report based on application No. DE10 2013 106 855.3(5 pages) dated Mar. 31, 2014.

* cited by examiner

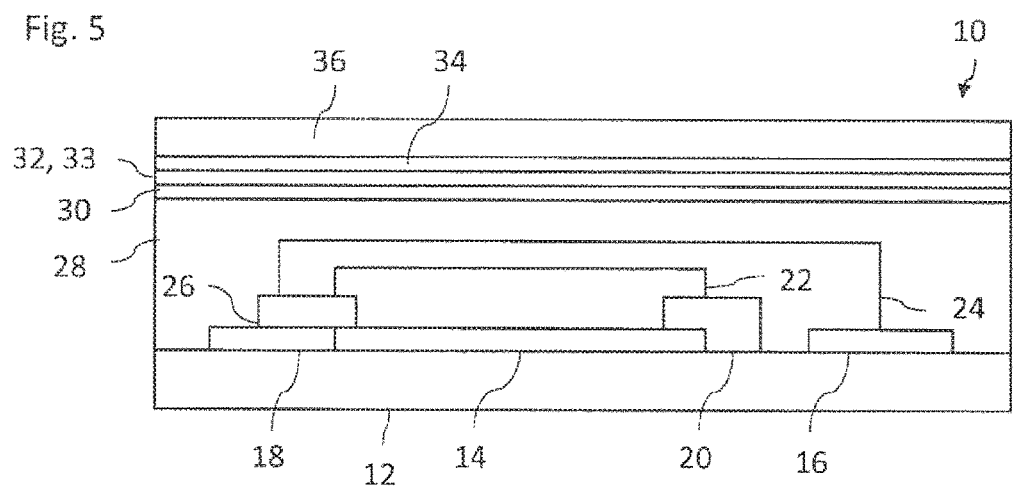
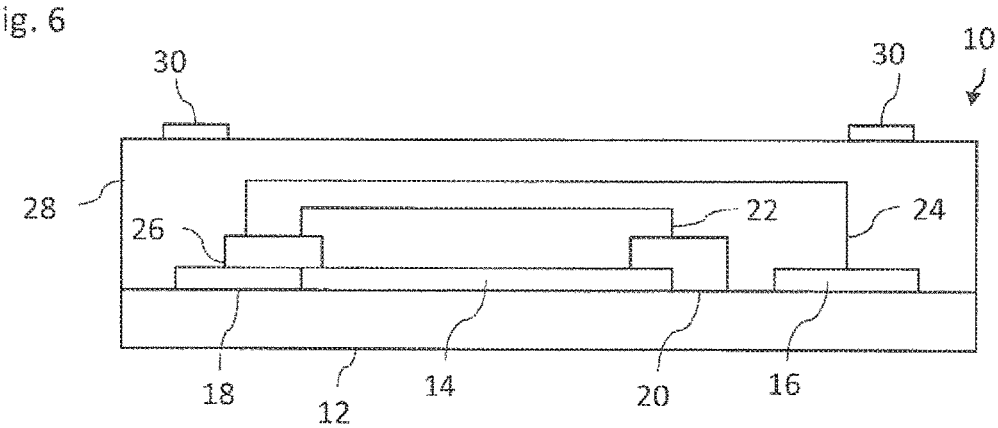
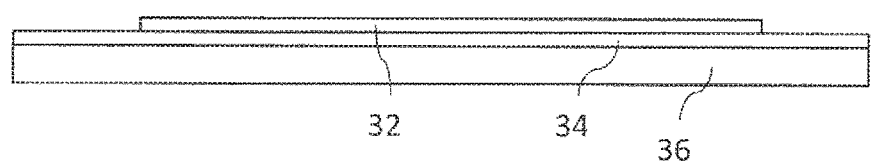

OPTOELECTRONIC COMPONENT AND METHOD FOR PRODUCING SAME

RELATED APPLICATIONS

The present application is a national stage entry according to 35 U.S.C. §371 of PCT application No.: PCT/EP2014/063882 filed on Jun. 30, 2014 which claims priority from German application No.: 10 2013 106 855.3 filed on Jul. 1, 2013, and is incorporated herein by reference in its entirety.

TECHNICAL FIELD

Various embodiments relate to a method for producing an optoelectronic component, and to an optoelectronic component.

BACKGROUND

In a conventional optoelectronic component, adhesion media, for example adhesives, solders, lacquers, encapsulation layers, for example a thin film encapsulation (TFE) or a cavity encapsulation, metal seals and/or covering bodies, such as glass bodies, for example, are used for connecting and/or sealing component parts of the optoelectronic component. The application of these auxiliary media to the component parts of the optoelectronic component that are to be connected and/or sealed can often be relatively time-consuming, cost-intensive, insufficiently tight and/or imprecise. By way of example, when an epoxy adhesive is used for fixing a covering body, air or moisture can diffuse into the component via the adhesive. A large-area adhesive joint can have a high particle sensitivity. When the adhesive is applied by screen printing, an accuracy can be of the order of magnitude of only one millimeter.

SUMMARY

In various embodiments, a method for producing an optoelectronic component is provided which makes it possible to produce the optoelectronic component simply, expediently and/or precisely and/or to connect and/or seal component parts of the optoelectronic component to one another simply, cost-effectively and/or precisely.

In various embodiments, an optoelectronic component is provided which is producible simply, expediently and/or precisely and/or whose component parts are connected and/or sealed to one another simply, cost-effectively and/or precisely.

In various embodiments, a method for producing an optoelectronic component is provided. In this case, an optoelectronic layer structure having a first adhesion layer, which includes a first metallic material, is formed above a carrier. A covering body with a second adhesion layer, which includes a second metallic material, is provided. A first alloy is applied to at least one of the two adhesion layers, the melting point of said first alloy being so low that the first alloy is liquid. The covering body is coupled to the optoelectronic layer structure in such a way that both adhesion layers are in direct physical contact with the liquid first alloy. At least part of the first alloy reacts chemically with the metallic materials of the first and second adhesion layers, as a result of which at least one second alloy is formed, the melting point of which is higher than the melting point of the first alloy, wherein the melting point of the second alloy is so high that the second alloy solidifies and fixedly connects the covering body to the optoelectronic layer structure.

The coupling of the covering body to the optoelectronic layer structure with the aid of the liquid first alloy makes it possible to produce the optoelectronic component simply, expediently and/or precisely, and to connect and/or seal the component parts of the optoelectronic component, in particular the covering body and the optoelectronic layer structure, to one another simply, cost-effectively and/or precisely.

The coupling of the covering body to the optoelectronic layer structure with the aid of the liquid first alloy takes place at a temperature which is above the melting point of the first alloy and at which the first alloy is thus present in a liquid state of matter. At the same time, the temperature is below the melting point of the second alloy, which is therefore not liquid at this temperature and solidifies during its formation or shortly thereafter. Furthermore, the temperature is below a temperature at which other component parts of the optoelectronic component, in particular of the optoelectronic layer structure, are damaged on account of thermal effects. By way of example, the melting point of the first alloy can be as low as possible, such that the process temperature for processing the first alloy can also be as low as possible, as a result of which the optoelectronic layer structure, for example organic layers of the optoelectronic layer structure, is/are preserved. The second alloy can be tight and solid for example at all process temperatures that occur, for example at temperatures in the range of −40° C. to 100° C.

Upon contact with the metallic materials of the adhesion layers, the metals of the first alloy present in a liquid state of matter enter into chemical compounds with the metallic materials of the adhesion layers and at least the second alloy forms from the metals of the first alloy and the metallic materials of the adhesion layers. On account of the currently prevailing temperature below the melting point of the second alloy, the latter undergoes transition to its solid state of matter and solidifies. In this case, the covering body and the optoelectronic layer structure are cohesively connected to one another. If this process takes place completely around a predefined region, then this predefined region is sealed, for example in a liquid-tight and/or gas-tight manner, relative to the surroundings. The first alloy can be applied to one of the adhesion layers particularly precisely, for example, if the adhesion layer is delimited by an anti-adhesion layer that is not wetted by the first alloy. The anti-adhesion layer can also be formed by a surface of the covering body or of the optoelectronic layer structure. In other words, a surface of the covering body or of the optoelectronic layer structure outside the adhesion layers can act as an anti-adhesion layer.

The fact that the first alloy is liquid means that the first alloy is present in a liquid state of matter. This is in contrast to a situation in which although alloy particles are present in a solid state of matter, they are embedded in a liquid or viscous carrier material, such as, for example, solder balls in a solder paste. The fact that at least one second alloy is formed means that the liquid first alloy together with the first and/or second metallic material forms the second alloy, wherein the first and second metallic materials can be identical or different. If the first and second metallic materials are identical, then exactly the second alloy is formed. If the first and second metallic materials are different, the first alloy together with the first metallic material can form the second alloy and together with the second metallic material can form a further alloy, for example a third alloy, the melting point of which in accordance with the second alloy is above the processing temperature.

The fact that the covering body is provided can mean, for example, that the covering body is arranged as a finished formed body or that the covering body is formed. The covering body may include and/or be formed from plastic, glass or metal, for example.

The first adhesion layer can be part of a component part of the optoelectronic layer structure, for example a surface of an electrode or electrode layer, or the first adhesion layer can be applied to a component part of the optoelectronic layer structure, for example to an encapsulation layer, for example by being deposited thereon. The second adhesion layer can be formed integrally with the covering body. In other words, the second adhesion layer can be formed by the material of the covering body. By way of example, the covering body may include a metal-containing glass including the second metallic material. As an alternative thereto, the second adhesion layer can be formed on the covering body. By way of example, the covering body can be coated with the second adhesion layer. The first and/or second metallic material and, if appropriate, further metallic materials can be metals or semimetals, for example. The first and/or the second adhesion layer can be formed by an alloy, in particular an adhesion alloy. The adhesion alloy can for example firstly be present in a liquid or viscous state and can then react with the first alloy to form the second alloy and then solidify.

The optoelectronic layer structure can have functional layers and/or an encapsulation layer, for example. The functional layers can be electrically active, optically active and/or optically passive layers. For example, electric currents can flow in the electrically active layers. The electrically active layers may include for example an anode, a cathode, a hole transport layer, one or more injection layers and/or an electron transport layer. In the optically active layers, as a result of recombination of electrons and holes, for example, photons can be formed and electromagnetic radiation can be generated. The optically passive layers can serve for example for influencing, for example for controlling, refracting or converting, the electromagnetic radiation generated.

In various embodiments, the melting point of the first alloy is in a range of between −20° C. and 100° C., in particular between 0° C. and 80° C. or between −20° C. and 0° C., in particular between 20° C. and 30° C. This makes it possible to process the first alloy in a liquid state at a temperature which is harmless or at least substantially harmless for other component parts of the optoelectronic component, for example for an organic functional layer structure in the case of an OLED.

In various embodiments, the first alloy is liquid at room temperature. This makes it possible to produce the optoelectronic component particularly expediently and simply. In particular, when using the first alloy, temperature regulation of the components parts of the optoelectronic component is not necessary.

In various embodiments, the first alloy includes gallium, indium, copper, molybdenum, silver, tin and/or bismuth. The first and/or second metallic material may include for example aluminum, nickel, tin, zinc, copper, molybdenum and/or chromium.

In various embodiments, the covering body is formed by a cover plate and a carrier structure. The carrier structure has the second adhesion layer. The covering body is coupled to the optoelectronic layer structure via the carrier structure. In other words, in this embodiment, the covering body is formed in a multipartite fashion, wherein the carrier structure is part of the covering body and the coupling to the optoelectronic layer structure is carried out via the second adhesion layer of the carrier structure of the covering body.

The second adhesion layer can be formed by the carrier structure, that is to say for example by a surface of the carrier structure, or the second adhesion layer can be formed on a surface of the carrier structure. The carrier structure can contribute, for example, to predefining a distance between the optoelectronic layer structure and the cover plate. The carrier structure can serve, for example, to provide a cavity delimited by the optoelectronic layer structure, the cover plate and the carrier structure. For example, a getter material for absorbing moisture can be arranged in the cavity. The carrier structure can serve, for example, to delimit the optoelectronic component in a lateral direction and/or laterally. The cover plate may include glass, plastic, semimetal and/or metal, for example. The carrier structure may include metal or a semimetal, for example.

In various embodiments, the cover plate has a third adhesion layer, which includes a third metallic material. The carrier structure has a fourth adhesion layer, which includes a fourth metallic material, on a side of the carrier structure facing away from the second adhesion layer. The cover plate is coupled to the carrier structure by virtue of the fact that a liquid alloy, for example the first alloy, is applied to the third and/or the fourth adhesion layer and the carrier structure is arranged on the cover plate in such a way that the third and fourth adhesion layers are in direct physical contact with the first alloy. At least part of the first alloy reacts chemically with the metallic materials of the third and fourth adhesion layers, as a result of which the second or a further alloy is formed, which solidifies and which thus fixedly connects the cover plate to the carrier structure. This can contribute to forming the covering body simply, cost-effectively, precisely, in a liquid-tight manner and/or in a gas-tight manner. The cover plate can be coupled to the carrier structure before or after the coupling of the carrier structure to the optoelectronic layer structure. The third and/or fourth adhesion layer may include the same metallic material as or a different metallic material than the first and/or second adhesion layer. The metallic material can be a metal or a semimetal, for example.

In various embodiments, the optoelectronic layer structure includes an encapsulation layer. The first adhesion layer is formed on the encapsulation layer. The encapsulation layer contributes to protecting further component parts of the optoelectronic component against moisture, particles, and/or air. Said further component parts can be functional layers in the case of LEDs and/or organic functional layers in the case of OLEDs, for example.

In various embodiments, the optoelectronic layer structure includes the carrier structure having the first adhesion layer. The covering body is coupled to the optoelectronic layer structure via the carrier structure. In other words, in this embodiment, the carrier structure forms part of the optoelectronic layer structure and the optoelectronic layer structure is coupled to the covering body, which in this context is formed by the cover plate, via the carrier structure.

In various embodiments, the optoelectronic layer structure includes a fifth adhesion layer, which includes a fifth metallic material, and the carrier structure has a sixth adhesion layer, which includes a sixth metallic material, on a side of the carrier structure facing away from the first adhesion layer. The carrier structure is coupled to the optoelectronic layer structure by virtue of the fact that a liquid alloy, for example the first alloy, is applied to the fifth and/or the sixth adhesion layer. The carrier structure is arranged on the optoelectronic layer structure in such a way that the fifth and sixth adhesion layers are in direct physical contact with the first alloy. At least part of the first alloy reacts chemically with the metallic materials of the fifth and sixth adhesion layers, as a result of which the second alloy is formed, which solidifies and which thus fixedly connects the optoelectronic layer structure to the carrier structure. If the third and/or the fourth metal are/is the same metal(s) as the first metal, then exactly one second alloy is formed. If the third and/or the fourth metal are/is different than the first metal, a further alloy, for example the third, a fourth or a fifth alloy, can be formed. The adhesion layers can be formed by corresponding adhesion alloys.

In various embodiments, the carrier structure is formed in a frame-shaped fashion. The first alloy is poured into the frame-shaped carrier structure, such that the carrier structure delimits the first alloy in a lateral direction. The carrier structure may thus serve as delimitation and/or shaping element for the liquid first alloy.

In various embodiments, the carrier structure is formed in a frame-shaped fashion in such a way that the carrier structure surrounds at least part of the optoelectronic layer structure in a lateral direction.

In various embodiments, an optoelectronic component is provided, for example the optoelectronic component which is produced with the aid of the method explained above. The optoelectronic component includes the carrier. The optoelectronic layer structure including the first adhesion layer, which includes the first metallic material, is formed above the carrier. The covering body has the second adhesion layer, which includes the second metallic material. A second alloy is arranged between the two adhesion layers and is in direct physical contact with the two adhesion layers. The covering body is coupled to the optoelectronic layer structure via the two adhesion layers and the second alloy. The second alloy is formed in a chemical reaction of the liquid first alloy and of the metals of the first and second adhesion layers. The second alloy, the melting point of which is higher than the melting point of the first alloy, is solidified and thus fixedly connects the covering body to the optoelectronic layer structure. In addition to the second alloy, part of the first alloy can also be present in a liquid state.

In various embodiments, part of the first alloy is present in a liquid state between the covering body and the optoelectronic layer structure.

In various embodiments, the melting point of the first alloy is in a range of between −20° C. and 100° C., in particular between 0° C. and 80° C. or between −20° C. and 0° C., in particular between 20° C. and 30° C. By way of example, the first alloy is liquid at room temperature.

In various embodiments, the first alloy includes gallium, indium, tin and/or bismuth and/or the first and/or the second metallic material includes aluminum, nickel, tin, chromium and/or other metals.

In various embodiments, the covering body includes a cover plate and a carrier structure having the second adhesion layer. The covering body is coupled to the optoelectronic layer structure via the carrier structure. The second adhesion layer can be formed integrally with the carrier structure, for example. In other words, the second adhesion layer can be formed by the carrier structure. By way of example, the carrier structure may include glass including the second metallic material. As an alternative thereto, the second adhesion layer can be formed on the carrier structure. By way of example, the carrier structure can be coated with the second adhesion layer.

In various embodiments, the optoelectronic layer structure includes a carrier structure having the first adhesion layer. The covering body is coupled to the optoelectronic layer structure via the carrier structure. The first adhesion layer can be formed integrally with the carrier structure, for example. In other words, the first adhesion layer can be formed by the carrier structure. By way of example, the carrier structure may include glass including the first metallic material. As an alternative thereto, the first adhesion layer can be formed on the carrier structure. By way of example, the carrier structure can be coated with the first adhesion layer.

In various embodiments, the use of a liquid first alloy for producing an optoelectronic component is proposed, wherein the liquid first alloy is used as adhesion medium and/or as sealing element. The liquid first alloy is for example the first alloy explained above. The optoelectronic component is for example the optoelectronic component explained above. The first alloy can be used when producing the optoelectronic component for example in accordance with the method explained above.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 5 shows the optoelectronic component in accordance with FIGS. 1 to 4;

FIG. 6 shows first component parts of one embodiment of an optoelectronic component during a method for producing the optoelectronic component;

FIG. 7 shows second component parts of the optoelectronic component during the method for producing the optoelectronic component in accordance with FIG. 6;

DETAILED DESCRIPTION

Figure 1:
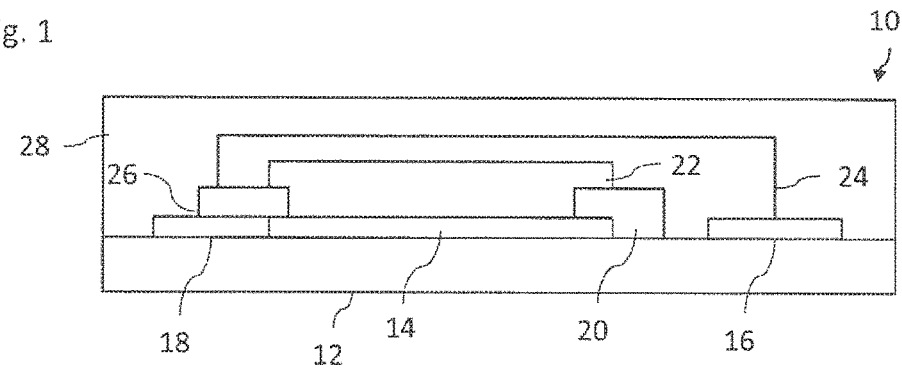
FIG. 1 shows first component parts of one embodiment of an optoelectronic component in a first state during a method for producing the optoelectronic component.

In the following detailed description, reference is made to the accompanying drawings, which form part of this description and show for illustration purposes specific embodiment s in which the invention can be implemented. In this regard, direction terminology such as, for instance, "at the top", "at the bottom", "at the front", "at the back", "front", "rear", etc. is used with respect to the orientation of the figure(s) described. Since component parts of embodi- ment s can be positioned in a number of different orienta- tions, the direction terminology serves for illustration and is not restrictive in any way whatsoever. It goes without saying that other embodiment s can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, an optoelectronic component can be an electromagnetic radiation emitting component or an electromagnetic radiation absorbing component. An elec- tromagnetic radiation absorbing component can be a solar cell, for example. An electromagnetic radiation emitting component can be for example an electromagnetic radiation emitting semiconductor component and/or can be formed as an electromagnetic radiation emitting diode, as an organic electromagnetic radiation emitting diode, as an electromag- netic radiation emitting transistor or as an organic electro- magnetic radiation emitting transistor. The radiation can be for example light in the visible range, UV light and/or infrared light. In this connection, the electromagnetic radia- tion emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing. In various embodiments, an optoelec- tronic component can be designed as a top and/or bottom emitter. A top and/or bottom emitter can also be designated as optically transparent component, for example a transpar- ent organic lighting diode.

In the case of a cohesive connection, a first body can be connected to a second body by atomic and/or molecular forces. Cohesive connections can often be non-releasable connections. In various configurations, a cohesive connec- tion can be realized for example as an adhesive connection, a solder connection, for example of a glass solder or of a metal solder, or as a welded connection.

In various embodiments, the term "translucent" or "trans- lucent layer" can be understood to mean that a layer is transmissive to light, for example to the light generated by the light emitting component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "trans- parent layer" can be understood to mean that a layer is transmissive to light (for example at least in a partial range of the wavelength range of from 380 nm to 780 nm), wherein light coupled into a structure (for example a layer) is also coupled out from the structure (for example layer) substan- tially without scattering or light conversion.

A metallic material may include or be a metal and/or a semimetal, for example.

FIG. 1 shows first component parts of one embodiment of an optoelectronic component 10 in a first state during a method for producing the optoelectronic component 10. The optoelectronic component 10 includes a carrier 12. The carrier 12 can be formed as a protective layer, for example. The carrier 12 can serve for example as a carrier element for electronic elements or layers, for example light emitting elements. By way of example, the carrier 12 may include or be formed from glass, quartz and/or a semiconductor mate- rial. Furthermore, the carrier 12 may include or be formed from a plastics film or a laminate including one or including a plurality of plastics films. The plastic may include or be formed from one or more polyolefins (for example high or low density polyethylene (PE) or polypropylene (PP)). Fur- thermore, the plastic may include or be formed from poly- vinyl chloride (PVC), polystyrene (PS), polyester and/or polycarbonate (PC), polyethylene terephthalate (PET), polyethersulfone (PES) and/or polyethylene naphthalate (PEN). The carrier 12 may include one or more of the materials mentioned above. The carrier 12 may include or be formed from a metal or a metal compound, for example copper, silver, gold, platinum or the like. The carrier 12 including a metal or a metal compound can also be embod- ied as a metal film or a metal-coated film. The carrier 12 can be embodied as translucent or transparent.

In various embodiments, a barrier layer (not illustrated) can optionally be arranged on or above the carrier. The barrier layer may include or consist of one or more of the following substances: aluminum oxide, zinc oxide, zirco- nium oxide, titanium oxide, hafnium oxide, tantalum oxide, lanthanum oxide, silicon oxide, silicon nitride, silicon oxynitride, indium tin oxide, indium zinc oxide, aluminum- doped zinc oxide, and mixtures and alloys thereof. Further- more, in various embodiments, the barrier layer can have a layer thickness in a range of approximately 0.1 nm (one atomic layer) to approximately 5000 nm, for example a layer thickness in a range of approximately 10 nm to approxi- mately 200 nm, for example a layer thickness of approxi- mately 40 nm.

An active region of the optoelectronic component 10 is arranged on or above the carrier 12 or the barrier layer. The active region can be understood as that region of the optoelectronic component 10 in which electric current for the operation of the optoelectronic component 10 flows and the electromagnetic radiation is generated or absorbed. The active region includes a first electrode layer 14, a second electrode layer 24 and a functional layer structure 22 ther- ebetween.

The first electrode layer 14 is formed on the carrier if the barrier layer is not present. The first electrode layer 14 can be formed from an electrically conductive material, such as, for example, a metal or a transparent conductive oxide (TCO) or a layer stack including a plurality of layers of the same metal or different metals and/or the same TCO or different TCOs. Transparent conductive oxides are transpar- ent conductive substances, for example metal oxides, such as, for example, zinc oxide, tin oxide, cadmium oxide, titanium oxide, indium oxide, or indium tin oxide (ITO).

Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped. The first electrode layer 14 may include a metal; for example Ag, Pt, Au, Mg, Al, Ba, In, Ag, Au, Mg, Ca, Sm or Li, and compounds, combinations or alloys of these substances. The first electrode layer 14 can be formed by a layer stack of a combination of a layer of a metal on a layer of a TCO, or vice versa. One example is a silver layer applied on an indium tin oxide layer (ITO) (Ag on ITO) or ITO-Ag-ITO multilayers.

The first electrode layer 14 may include one or a plurality of the following materials as an alternative or in addition to the abovementioned materials: networks composed of metallic nanowires and nanoparticles, for example composed of Ag; networks composed of carbon nanotubes; graphene particles and graphene layers; networks composed of semiconducting nanowires. Furthermore, the first electrode layer 14 may include electrically conductive polymers or transition metal oxides or transparent electrically conductive oxides.

In various embodiments, the first electrode layer 14 and the carrier 12 can be formed as translucent or transparent. The first electrode layer 14 can have for example a layer thickness in a range of approximately 1 nm to approximately 500 nm, for example a layer thickness in a range of approximately 10 nm to approximately 250 nm, for example a layer thickness in a range of approximately 100 nm to approximately 150 nm.

The first electrode layer 14 can be formed as an anode, that is to say as a hole-injecting electrode, or as a cathode, that is to say as an electron-injecting electrode.

Alongside the first electrode layer 14, a first contact feed 18 is formed on the carrier 12, said first contact feed being electrically coupled to the first electrode layer 14. The first contact feed 18 can be coupled to a first electrical potential (provided by an energy source (not illustrated), for example a current source or a voltage source). Alternatively, the first electrical potential can be applied to the carrier 12 and then be applied indirectly to the first electrode layer 14 via said carrier. The first electrical potential can be for example the ground potential or some other predefined reference potential.

The functional layer structure 22, for example an organic functional layer structure, is formed above the first electrode layer 14. The functional layer structure 22 may include one or a plurality of emitter layers, for example including fluorescent and/or phosphorescent emitters, and one or a plurality of hole-conducting layers (also designated as hole transport layer(s)). In various embodiments, one or a plurality of electron-conducting layers (also designated as electron transport layer(s)) can alternatively or additionally be provided.

Examples of emitter materials which can be used in the optoelectronic component 10 in accordance with various embodiments for the emitter layer(s) include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III)), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]-ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]anthracene) and red fluorescent DCM2 ((4-dicyanomethylene)-2-methyl-6-julolidyl-9-enyl-4H-pyran) as non-polymeric emitters. Such non-polymeric emitters can be deposited by thermal evaporation, for example. Furthermore, it is possible to use polymer emitters, which can be deposited, in particular, by a wet-chemical method such as spin coating, for example. The emitter materials can be embedded in a matrix material in a suitable manner.

The emitter materials of the emitter layer(s) can be selected for example such that the optoelectronic component 10 emits white light. The emitter layer(s) may include a plurality of emitter materials that emit in different colors (for example blue and yellow or blue, green and red); alternatively, the emitter layer(s) can also be constructed from a plurality of partial layers, such as a blue fluorescent emitter layer or blue phosphorescent emitter layer, a green phosphorescent emitter layer and a red phosphorescent emitter layer. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The functional layer structure 22 may generally include one or a plurality of electroluminescent layers. The one or the plurality of electroluminescent layers may include organic polymers, organic oligomers, organic monomers, organic small, non-polymeric molecules ("small molecules") or a combination of these substances. By way of example, the functional layer structure 22 may include one or a plurality of electroluminescent layers embodied as a hole transport layer, so as to enable for example in the case of an OLED an effective hole injection into an electroluminescent layer or an electroluminescent region. Alternatively, in various embodiments, the functional layer structure 22 may include one or a plurality of functional layers embodied as an electron transport layer, so as to enable for example in an OLED an effective electron injection into an electroluminescent layer or an electroluminescent region. By way of example, tertiary amines, carbazole derivatives, conductive polyaniline or polyethylene dioxythiophene can be used as material for the hole transport layer. In various embodiments, the one or the plurality of electroluminescent layers can be embodied as an electroluminescent layer.

In various embodiments, the hole transport layer can be applied, for example deposited, on or above the first electrode layer 14, and the emitter layer can be applied, for example deposited, on or above the hole transport layer. In various embodiments, the electron transport layer can be applied, for example deposited, on or above the emitter layer.

In various embodiments, the functional layer structure can have a layer thickness in a range of approximately 10 nm to approximately 3 μm, for example of approximately 100 nm to approximately 1 μm, for example of approximately 300 nm to approximately 800 nm. In various embodiments, the functional layer structure 22 can have for example a stack of layers from among those mentioned arranged one above another.

The optoelectronic component 10 may optionally generally include further functional layers, for example arranged on or above the one or the plurality of emitter layers or on or above the electron transport layer(s), which serve to further improve the functionality and thus the efficiency of the optoelectronic component 10.

The second electrode layer 24 is formed over the functional layer structure 22. Alongside the first electrode layer 14, to be precise on a side of the first electrode layer 14 facing away from the first contact feed 18, a second contact feed 16 is formed above the carrier 12. The contact feed 16 is electrically coupled to the second electrode layer 24. The second contact feed 16 serves for electrically contacting the second electrode layer 24. A second electrical potential can be applied to the second contact feed 16. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V. The second electrode layer 24 may include or be formed from the same substances as the first electrode layer 14. The second electrode layer 24 can have for example a layer thickness in a range of approximately 1 nm to approximately 100 nm, for example of approximately 10 nm to approximately 50 nm, for example of approximately 15 nm to approximately 30 nm. The second electrode layer 24 can generally be formed in a manner similar to a configuration of the first electrode layer 14 or differently than the latter. The second electrode layer 24 can be formed as an anode, that is to say as a hole-injecting electrode, or as a cathode, that is to say as an electron-injecting electrode.

In various embodiments, the first electrode layer 14 and the second electrode layer 24 are both formed as translucent or transparent. Consequently, the optoelectronic component 10 can be formed as a top and bottom emitter and/or as a transparent optoelectronic component 10.

The electrical contact feeds 18, 16 can serve for example as parts of the anode and cathode, respectively. The electrical contact feeds 18, 16 can be formed such that they are transparent or non-transparent. The electrical contact feeds 18, 16 may include for example partial layers including for example molybdenum/aluminum, molybdenum, chromium/aluminum/chromium, silver/magnesium or exclusively aluminum. The second electrode layer 24 is separated from the first contact feed 18 and the first electrode layer 14 by a first insulator layer 20 and a second insulator layer 26. The insulator layers 20, 26 include polyimide, for example, and are formed optionally.

The carrier 12 with the first electrode layer 14, the contact feeds 16, 18 and the insulator layers 20, 26 can also be designated as a substrate. The functional layer structure 22 is formed on the substrate.

An encapsulation layer 28 is formed over the second electrode layer 24 and partly above the first contact feed 18, the second contact feed 16 and the second insulator layer 26. The encapsulation layer 28 thus covers the first contact feed 18 and the second contact feed 16 and can subsequently be exposed for electrically contacting the contact feeds 18, 16. The encapsulation layer 28 can be formed for example in the form of a barrier thin-film layer or thin-film encapsulation. In the context of this application, a "barrier thin-film layer" or a "thin-film encapsulation" can be understood to mean for example a layer or a layer structure which is suitable for forming a barrier against chemical impurities or atmospheric substances, in particular against water (moisture) and oxygen. In other words, the encapsulation layer 28 is formed in such a way that, for example, OLED-damaging substances such as water, oxygen or solvent cannot penetrate through it or at most very small proportions of said substances can penetrate through it.

In accordance with one configuration, the encapsulation layer 28 can be formed as an individual layer (to put it another way, as a single layer). In accordance with an alternative configuration, the encapsulation layer 28 may include a plurality of partial layers formed one on top of another. In other words, in accordance with one configuration, the encapsulation layer 28 can be formed as a layer stack. The encapsulation layer 28 or one or a plurality of partial layers of the encapsulation layer 28 can be formed for example by a suitable deposition method, e.g. by an atomic layer deposition (ALD) method, e.g. a plasma enhanced atomic layer deposition (PEALD) method or a plasmaless atomic layer deposition (PLALD) method, or by a chemical vapor deposition (CVD) method, e.g. a plasma enhanced chemical vapor deposition (PECVD) method or a plasmaless chemical vapor deposition (PLCVD) method. In accordance with one configuration, in the case of the encapsulation layer 28 having a plurality of partial layers, all the partial layers can be formed by an atomic layer deposition method. A layer sequence including only ALD layers can also be designated as a "nanolaminate". By using an atomic layer deposition (ALD) method, it is possible for very thin layers to be deposited. In particular, layers having layer thicknesses in the atomic layer range can be deposited.

In accordance with one configuration, the encapsulation layer 28 can have a layer thickness of approximately 0.1 nm (one atomic layer) to approximately 1000 nm, for example a layer thickness of approximately 10 nm to approximately 100 nm, for example approximately 40 nm.

In accordance with one configuration in which the encapsulation layer 28 includes a plurality of partial layers, all the partial layers can have the same layer thickness. In accordance with another configuration, the individual partial layers of the encapsulation layer 28 can have different layer thicknesses. In other words, at least one of the partial layers can have a different layer thickness than one or more other partial layers. The encapsulation layer 28 or the individual partial layers of the encapsulation layer 28 can be formed as a translucent or transparent layer.

In accordance with one configuration, the encapsulation layer 28 or one or a plurality of the partial layers of the encapsulation layer 28 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys and/or arbitrary layer structures thereof. In various embodiments, the encapsulation layer 28 or one or a plurality of the partial layers of the encapsulation layer 28 may include one or a plurality of high refractive index substances, to put it another way one or a plurality of substances having a high refractive index, for example having a refractive index of at least 2.

The encapsulation layer 28 can cover the underlying layers for example in a planar fashion without lateral structuring. In this application, the lateral direction denotes a direction which is parallel to the plane which is formed by the surface of the carrier 12 on which the first electrode layer 14 is formed.

In various embodiments, above the second electrode layer 24, an electrically insulating layer (not illustrated) can be applied, for example SiN, $SiO_x$, $SiNO_x$ or ATO, for example AlTiO$_x$, for example having a layer thickness in a range of approximately 300 nm to approximately 1.5 μm, for example having a layer thickness in a range of approximately 500 nm to approximately 1 μm, in order to protect electrically unstable substances. Furthermore, in various embodiments, one or a plurality of antireflection layers can additionally be provided.

Figure 2:
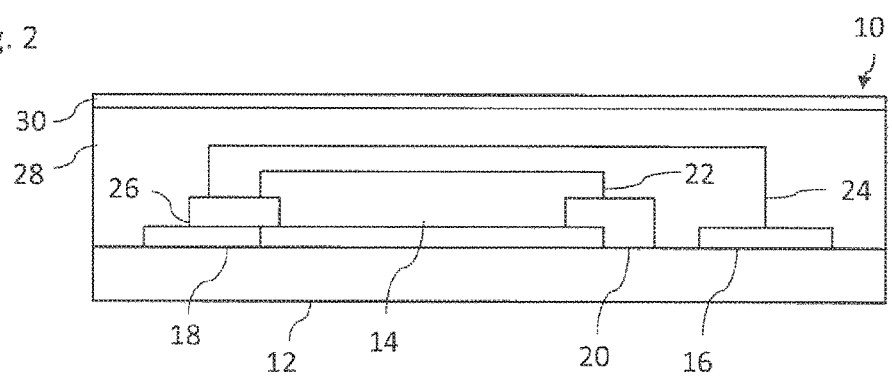
FIG. 2 shows the first component parts of the optoelectronic component in accordance with FIG. 1 in a second state during the method for producing the optoelectronic component.

FIG. 2 shows the optoelectronic component 10 in accordance with FIG. 1 in a second state during the method for producing the optoelectronic component 10. In this state, a first adhesion layer 30 is formed on the encapsulation layer 28. The first adhesion layer 30 can be formed for example in a manner closed in a planar manner or in a laterally structured manner on the encapsulation layer 28 or can be applied to the latter. The first adhesion layer 30 includes a first metallic material. The first metallic material may include for example aluminum, zinc, chromium, tin, copper, molybdenum, gold and/or nickel. The first adhesion layer can have for example a thickness in the range of 10 nm to 100 μm, for example of 15 nm to 50 μm, for example of 20 nm to 25 μm. The first adhesion layer 30 may include for example a plurality of partial layers formed one above another. If the first adhesion layer 30 is formed such that it is structured in a lateral direction, then the first adhesion layer 30 can for example firstly be applied to the encapsulation layer 28 in a manner closed in a planar manner and can subsequently be structured, for example with the aid of a masking and removal process, or the first adhesion layer 30 can be applied in a directly structured manner, for example with the aid of a printing method. The adhesion layer 30 and, if appropriate, further adhesion layers can be formed for example by an alloy, for example an adhesion alloy, which can for example firstly be present in a liquid or viscous state.

Figure 3:
FIG. 3 shows second component parts of the optoelectronic component in a first state during the method for producing the optoelectronic component.

FIG. 3 shows further component parts of the optoelectronic component 10 in a first state during the method for producing the optoelectronic component 10. In particular, FIG. 3 shows a covering body 36, on which a second adhesion layer 34 is formed. The covering body 36 may for example include glass and/or be formed by a laminating glass. The second adhesion layer 34 includes a second metallic material. The second metallic material can be the same metallic material as the first metallic material. As an alternative thereto, however, the second metallic material can also be a different metallic material. As an alternative thereto, the covering body 36 can also be formed as a protective layer or film. The second adhesion layer 34 can be formed in a manner closed in a planar manner on the covering body 36 or in a structured manner in a lateral direction on the covering body 36. If the second adhesion layer 34 is formed in a structured manner, then it can for example firstly be applied to the covering body 36 in a manner closed in a planar manner and can subsequently be structured, for example with the aid of a masking and/or removal process, or the second adhesion layer 34 can be applied in a directly structured manner, for example with the aid of a printing method.

Figure 4:
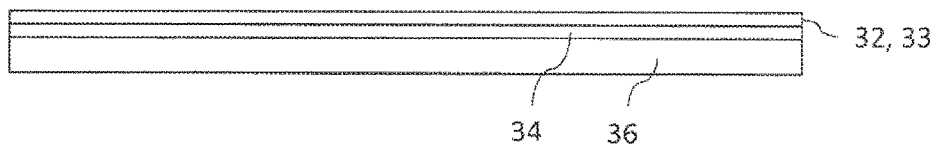
FIG. 4 shows the second component parts of the optoelectronic component in accordance with FIG. 3 in a second state during the method for producing the optoelectronic component.

FIG. 4 shows the further component parts of the optoelectronic component 10 from FIG. 3 in a second state during the method for producing the optoelectronic component 10. In particular, FIG. 4 shows the covering body 36 with the second adhesion layer 34. A liquid first alloy 32, that is to say in a liquid state of matter, is applied on the second adhesion layer 34. The first alloy 32 can be applied for example by printing, dispensing and/or as a solution.

The first alloy 32 has a low melting point. By way of example, the first alloy 32 is in its liquid state of matter at temperatures in a range of between −20 and 100° C., for example between 0° and 80° C., for example between 20° and 30° C. By way of example, the first alloy 32 is liquid at room temperature. In other words, the first alloy 32 in a liquid state at room temperature can be applied to the second adhesion layer 34. In this case, by way of example, surface effects, in particular a surface tension of the liquid first alloy 32, can prevent the latter from dripping laterally from the second adhesion layer 34. Alternatively or additionally, the second adhesion layer 34 can be delimited in a lateral direction by an anti-adhesion layer (not illustrated) that is not wetted by the first alloy 32 and keeps the first alloy 32 in a region provided therefor on the second adhesion layer 34. Such an anti-adhesion layer may include for example titanium oxide, gallium oxide, tungsten oxide, zirconium oxide and/or aluminum oxide.

The molecules of the first alloy 32, where they are in contact with the molecules and/or atoms of the second adhesion layer 34, enter into chemical compounds with the corresponding atoms and/or molecules. A second alloy 33 forms as a result, the melting point of which is significantly higher than that of the first alloy 32. In particular, the materials of the first alloy 32 and of the second adhesion layer 34 and the process parameters such as, for example, the processing temperature and the air pressure during processing are chosen such that the melting point of the first alloy 32 is below the process temperature and the melting point of the second alloy 33 is above the process temperature. This has the effect that the second alloy 33 solidifies during its formation or shortly thereafter and fixedly bonds to the second adhesion layer 34. The second alloy 33 is applied to the second adhesion layer 34 with a thickness such that only one part of the first alloy 32 reacts with the material of the second adhesion layer 34 and another part of the first alloy at least initially remains liquid. Optionally, an aftertreatment is possible, for example a heat treatment or a plasma process, in which properties of the alloys and/or of the adhesion layers and/or of the surfaces involved can be influenced, for example can be hardened.

The first alloy 32 may include for example gallium, indium, tin, copper, molybdenum, silver and/or bismuth. The first alloy 32 may include for example GaInSn, for example between 60% and 70% gallium, between 20% and 30% indium and between 10% and 20% tin. The first alloy 32 may include for example 68% gallium, 22% indium and 10% tin, wherein the first alloy 32 then has its melting point at approximately −19.5° C. and wherein the first alloy then wets glass, for example a cover plate. As an alternative thereto, the first alloy 32 may include for example 62% gallium, 22% indium and 16% tin, wherein the first alloy 32 then has its melting point at approximately 10.7° C. and wherein the first alloy 32 can then be referred to as Field's metal. The exact melting point can be set depending on the portion of tin in the first alloy. As an alternative thereto, the first alloy 32 may include InBiSn, for example 51% indium, 33% bismuth and 16% tin, wherein the first alloy then has its melting point at approximately 62° C. and wherein the first alloy then wets glass, for example the cover plate, and wherein the first alloy 32 can then be processed on a hot plate. Correspondingly, the second alloy 33 may include for example GaInSn having a significantly higher tin concentration or GaInSnAl. The first alloy 32 can be formed with a thickness of for example 10 nm to 50 μm, for example of 20 nm to 25 μm.

FIG. 5 shows the component parts of the optoelectronic component 10 in accordance with FIGS. 1 to 4, wherein the covering body 36 with the second adhesion layer 34 and the first alloy 32 and the second alloy 33 is applied to the first adhesion layer 30. As an alternative or in addition to applying the first alloy 32 to the second adhesion layer 34, the first alloy can also be applied to the first adhesion layer 30. In this context, the anti-adhesion layer can optionally be formed alongside the first adhesion layer 30, for example in order to precisely predefine where the first alloy 32 is intended to be arranged, and where not.

The first alloy 32 reacts with the first adhesion layer 30 in a similar manner to with the second adhesion layer 34. In particular, the second alloy 33 also forms on the first adhesion layer 30 and solidifies and thus fixedly couples the covering body 36 to the encapsulation layer 28. The first and second alloys 32, 33 respectively thus serve as adhesion media for fixing the covering body 36 to the encapsulation layer 28. If the first and/or second alloy 32, 33 are/is arranged in a manner closed in a planar manner between the two adhesion layers 30, 34, then the first and/or second alloy 32, 33 can also serve as sealant for sealing the optoelectronic component 10 against moisture, particles and/or gases from the air.

The second alloy 32 can be introduced between the two adhesion layers 30, 34 with a thickness such that the first alloy 32 reacts completely to form the second alloy 33 or that only one part of the first alloy 32 reacts with the material of the second adhesion layer and another part of the first alloy at least initially remains liquid.

FIG. 6 shows the component parts of the optoelectronic component 10 during the second state during the method for producing the optoelectronic component 10, which for example largely corresponds to the optoelectronic component 10 shown in FIG. 2. The first adhesion layer 30 is formed in a laterally structured manner on the encapsulation layer 28, only two side elements of the first adhesion layer 30 being shown in FIG. 6. In plan view, the first adhesion layer 30 can be formed in a frame-shaped fashion, however, wherein it can form a frame around the functional layer structure 22 in plan view. In other words, a frame structure can be formed by the first adhesion layer 30.

FIG. 7 shows the further component parts of the optoelectronic component 10 in the second state during the method for producing the optoelectronic component 10, wherein the further component parts can for example largely correspond to the component parts shown in FIG. 4. The first alloy 32 is applied to the second adhesion layer 34 only in a partial region. The partial region can correspond for example to the frame formed by the first adhesion layer 30 shown in FIG. 6, or to a region encompassed by the frame. The application of the liquid first alloy 32 only in the partial region can be controlled for example by the quantity of the first alloy 32 and/or with the aid of the anti-adhesion layers (not illustrated) that for example delimit the first adhesion layer 34 in a manner corresponding to the first adhesion layer 30 in a frame-shaped fashion. The first alloy 32 can be applied for example by printing, dispensing and/or as a solution.

Figure 8:
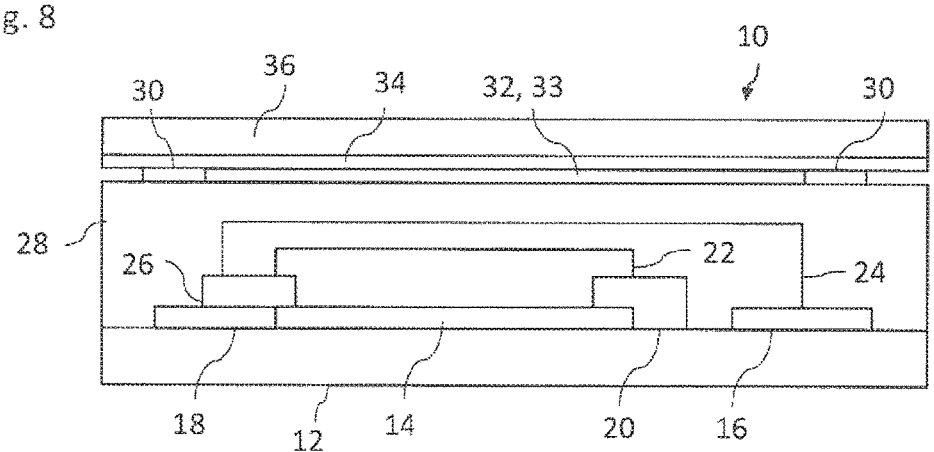
FIG. 8 shows the optoelectronic component in accordance with FIGS. 6 and 7.

FIG. 8 shows a further step during the method for producing the optoelectronic component 10, wherein the covering body 36 with the first adhesion layer 34 and the first alloy 32 in accordance with FIG. 7 is arranged on the encapsulation layer and the first adhesion layer 30 in accordance with FIG. 6. As an alternative or in addition to applying the first alloy 32 to the second adhesion layer 34, the first alloy 32 can also be applied to the first adhesion layer 30. The first alloy 32 forms the second alloy 33 in a chemical reaction with the metallic materials of the first and second adhesion layers 30, 34, which second alloy solidifies and thus fixedly couples the covering body 36 to the encapsulation layer 28. Furthermore, the second alloy 33 seals the region above the functional layer structure 22 in a lateral direction.

The first alloy 32 and the adhesion layers 30, 34 can be formed in such a way that the first alloy 32 reacts completely to form the second alloy 33. However, the first alloy 32 and/or the adhesion layers 30, 34 can alternatively also be formed such that the first alloy 32 reacts only partly to form the second alloy 33 and that the first alloy 32 is present in a liquid state in one or a plurality of partial regions even after the completion of the optoelectronic component 10. By way of example, in the completed optoelectronic component 10, the first alloy 32 above the functional layer structure 22 can be present in a liquid state. This can contribute to reducing internal stresses, for example on account of thermal and/or mechanical loading, and preventing damage to the optoelectronic component 10. Furthermore, this can contribute to reducing or preventing damage to the optoelectronic component 10 if particles penetrate into the layer construction during the method. The liquid first alloy 32 can then serve as a buffer, for example. Furthermore, the liquid first alloy 32, in the case of cracks and/or holes in the encapsulation layer 28, can penetrate into the corresponding cracks and/or holes and close them.

Figure 9:
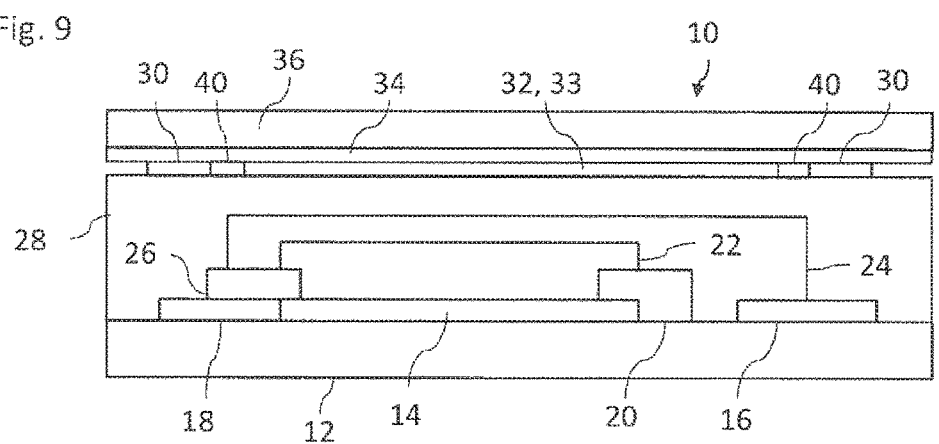
FIG. 9 shows one embodiment of an optoelectronic component.

FIG. 9 shows an optoelectronic component 10, which can for example largely correspond to the optoelectronic component 10 shown in FIG. 8. The optoelectronic component 10 includes a nonreactive material 40 at least in sections adjoining the first adhesion layer 30. The nonreactive material 40 in particular does not react chemically with the first alloy 32. In other words, no second alloy 33 forms in contact regions in which the first alloy 32 touches the nonreactive material 40. The nonreactive material 40 can be arranged alongside the first adhesion layer 30 for example in such a way that between the sections of the nonreactive material 40 the first alloy 32 can still react with the metallic material of the first adhesion layer 30, but the overall reaction is restricted, whereby it is possible to prevent the entire first alloy 32 from reacting to form the second alloy 33. As a result, in a targeted manner it is possible to provide regions in which the first alloy 32 is present in a liquid state even after the completion of the optoelectronic component 10. The nonreactive material may include for example nickel, aluminum oxide, titanium oxide, zirconium oxide and/or zinc oxide. The nonreactive material can be applied for example by dispensing, printing from emulsion and/or solution and/or by sputtering and/or by vapor deposition using one or a plurality of masks. The nonreactive material 40 can be chosen in such a way that it merely does not react with the first alloy 32 or that the first alloy 32 does not even wet the nonreactive material 40. As an alternative or in addition to the nonreactive material 40, it is possible to provide regions which are free of any material and merely have air or vacuum. Such regions can be provided for example with the aid of the anti-adhesion layers that cannot be wetted by the first alloy 32. An undesired further reaction of the first alloy 32 can be restricted and/or prevented with the aid of these free regions.

Figure 10:
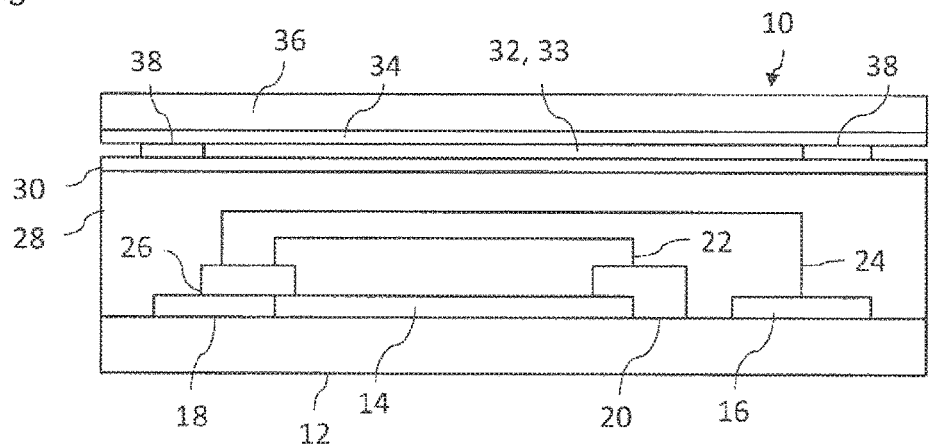
FIG. 10 shows one embodiment of an optoelectronic component.

FIG. 10 shows one embodiment of the optoelectronic component 10, which can for example largely correspond to one of the optoelectronic components 10 explained above. The optoelectronic component 10 includes a supporting structure 38, which runs in a frame-shaped fashion over the region in which the functional layer structure 22 is formed. The first and second adhesion layers 30, 34 are formed in a planar fashion in each case. The supporting structure 38 may include a material which reacts with the first alloy 32 in such a way that the second alloy 33 is formed. However, the supporting structure 38 may also include a nonreactive material. The nonreactive material can for example correspond to the nonreactive material 40 in accordance with FIG. 9.

The first alloy 32, the supporting structure 38 and the adhesion layers 30, 34 can be formed in such a way that the first alloy 32 reacts completely to form the second alloy 33. Alternatively, however, the first alloy 32 and/or the adhesion layers 30, 34 can also be formed in such a way that the first alloy 32 only partly reacts to form the second alloy 33 and that the first alloy 32 is present in a liquid state in one or a plurality of partial regions even after the completion of the optoelectronic component 10. By way of example, in the completed optoelectronic component 10, the first alloy above the functional layer structure 22 can be present in a liquid state.

Figure 11:
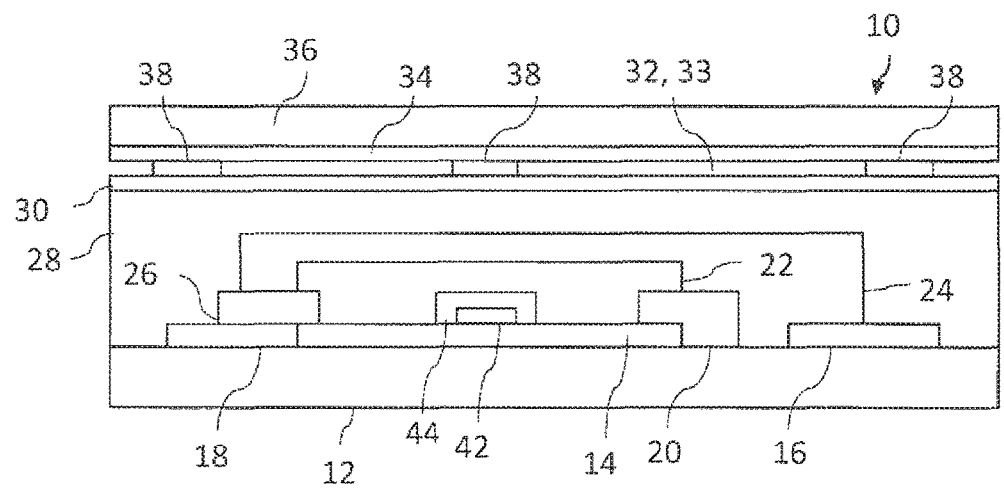
FIG. 11 shows one embodiment of an optoelectronic component.

FIG. 11 shows one embodiment of the optoelectronic component 10, which can for example largely correspond to one of the optoelectronic components 10 explained above. A current distribution element 42 is formed on the first electrode layer 14 and in a manner surrounded by the functional layer structure 22 and is separated from the functional layer structure by an insulating material 44. The current distribution element 42 can be referred to as "busbar", for example, and serves for distributing the electric current via the functional layer structure 22 in a lateral direction.

The optoelectronic component 10 includes the supporting structure 38, wherein the supporting structure 38 is formed not only in a frame-shaped fashion around the region above the functional layer structure 22, but also directly above the functional layer structure 22. The supporting structure 38 is thus formed in such a way that at least parts of the supporting structure 38 are formed above the distribution element 42. This arrangement of the supporting structure 38 is particularly expedient since the optoelectronic component 10 is formed particularly robustly in the region of the distribution element 42.

Figure 12:
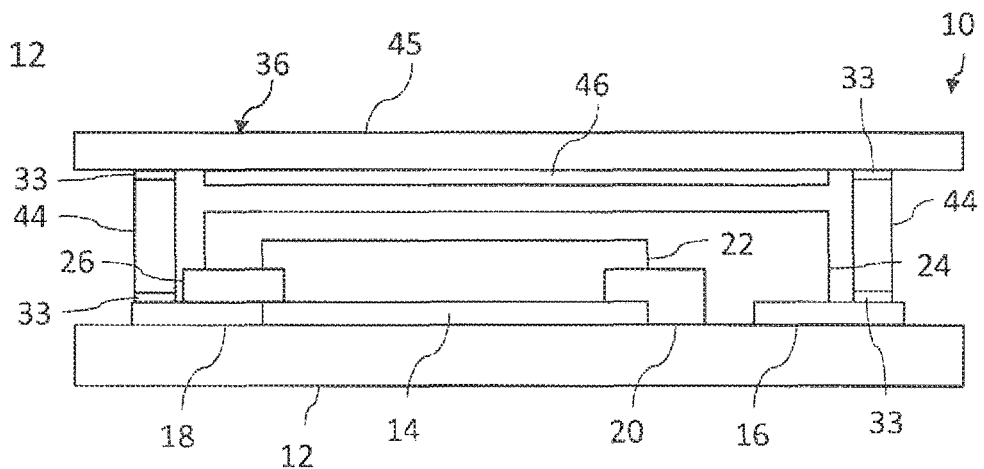
FIG. 12 shows one embodiment of an optoelectronic component.

FIG. 12 shows one embodiment of the optoelectronic component 10, which can for example largely correspond to one of the optoelectronic components 10 explained above. The optoelectronic component 10 does not include an encapsulation layer 28. The functional layer structure 22 is separated from the surroundings by the covering body 36, which includes a carrier structure 44 and a cover plate 45 in this embodiment. The carrier structure 44 forms a frame around the functional layer structure 22 and the second electrode layer 24 and separates the functional layer structure 22 from the surroundings in a lateral direction. In other words, the carrier structure 44 forms a lateral edge of the optoelectronic component 10.

The first adhesion layer 30 can be formed by the material of the contact feeds 18, 16. As an alternative thereto, the first adhesion layer 30 can be formed for example in regions of the contact feeds 18, 16 in which the carrier structure 44 adjoins the corresponding contact feeds 18, 16. Accordingly, the second adhesion layer 34 can be formed by the material of the carrier structure 44. As an alternative thereto, the second adhesion layer 34 can be formed on the carrier structure 44 on a side of the carrier structure 44 facing away from the cover plate 45.

During the method for producing the optoelectronic component 10, the first alloy 32 is applied to the first adhesion layer 30 and/or the second adhesion layer 34, which first alloy 32 then reacts to form the second alloy 33, as a result of which the covering body 36 and in particular the carrier structure 44 is fixedly connected to the optoelectronic layer structure and in particular the contact feeds 18, 16. Furthermore, the second alloy 33 seals the optoelectronic component 10 relative to the surroundings.

The cover plate 45 can be coupled to the carrier structure 44 with the aid of the first alloy 32. For this purpose, for example, the cover plate 45 can form a third adhesion layer or have a third adhesion layer (not illustrated), wherein the third adhesion layer includes a third metallic material. The third metallic material can for example correspond to the first or second metallic material or be different than the latter. Correspondingly, the carrier structure 44 can have a fourth adhesion layer or form a fourth adhesion layer, to be precise on a side of the carrier structure 44 facing the cover plate 45. The cover plate 45 can have the third adhesion layer in a region in which the carrier structure 44 adjoins the cover plate 45.

In the method for producing the optoelectronic component 10, one liquid alloy, for example the first alloy 32, is applied to the third and/or fourth adhesion layer. As an alternative thereto, another liquid alloy can be applied, which then reacts with the metallic materials and solidifies. Upon contact with the third and/or fourth adhesion layer, the second alloy 33 then forms if the third and/or fourth metallic material corresponds to the first and/or second metallic material. Otherwise, a further alloy can form, for example a fourth or fifth alloy, the melting points of which are likewise above the processing temperature and which therefore solidify in a manner corresponding to the second alloy 33. After the solidification of the alloys, a further processing of the solidified alloys is possible, for example a heat treatment, for example in order to harden the alloy.

During the method for producing the optoelectronic component, firstly the carrier structure 44 and the cover plate 45 can be coupled to one another and then be coupled to the optoelectronic layer structure, or the carrier structure 44 can first be coupled to the optoelectronic layer structure and then the cover plate 45 can be arranged.

As an alternative thereto, the covering body 36 can be formed exclusively by the cover plate 45, and the carrier structure 44 can be part of the optoelectronic layer structure. In this context, the first adhesion layer 30 is formed by the carrier structure 44 or is formed on a side of the carrier structure 44 facing the cover plate 45, and the second adhesion layer 34 is formed at least in a partial region of the cover plate 45 which adjoins the carrier structure 44. In the method for producing the optoelectronic component 10, one alloy, for example the first alloy 32, can be applied to the first and/or the second adhesion layer 30, 34. As an alternative thereto, another liquid alloy can be applied, which then reacts with the metallic materials and solidifies.

Optionally, the carrier structure 44 can likewise be coupled to the optoelectronic layer structure with the aid of one liquid alloy, for example the first alloy 32. As an alternative thereto, another liquid alloy can be applied, which then reacts with the metallic materials and solidifies. In this context, the carrier structure 44 forms a fifth adhesion layer, which includes for example a fifth metallic material, which for example can correspond to one of the metallic materials explained above or can be different than them. Correspondingly, the contact feeds 18, 16 form a sixth adhesion layer, which includes a sixth metallic material, for example. As an alternative thereto, the sixth adhesion layer is applied on the contact feeds 18, 16 at least in partial regions which adjoin the carrier structure 44. In the method for producing the optoelectronic component, for example, the first alloy 32 can then be applied to the fifth or sixth adhesion layer. In this case, the second alloy or a further alloy, for example a sixth or seventh alloy, can be formed, the melting points of which are likewise above the processing temperature and which therefore solidify in a manner corresponding to the second alloy 33.

A getter layer 46 can be arranged between the encapsulation layer 24 and the cover plate 45. The getter layer 46 may include or be formed from a getter, for example a solid or a dispensable getter. The getter layer 46 may include the getter for example in the form of particles that are distributed in a matrix. The getter may include a material which absorbs harmful substances and/or harmful substance mixtures, for example oxygen or moisture. The getter can be distributed in a matrix, for example in the form of particles or in dissolved form, and by the absorption of harmful substances or harmful substance mixtures can have the effect that the substance or the substance mixture of the matrix additionally has oxygen-repellent and/or moisture-repellent properties. In various configurations, the getter may for example include or be formed from an oxidizable material. The oxidizable material can react with oxygen and/or water and thereby bind these substances. Getters may therefore include or be formed from, for example, readily oxidizing substances from the chemical group of the alkali metals and/or alkaline earth metals, for example magnesium, calcium, barium, cesium, cobalt, yttrium, lanthanum and/or rare earth metals. Furthermore, other metals can also be suitable, for example aluminum, zirconium, tantalum, copper, silver and/or titanium, or oxidizable nonmetallic substances. Furthermore, the getter may also include or be formed from CaO, BaO and MgO. However, the getter may also include or be formed from a drying agent. The drying agent can for example irreversibly absorb water, without the volume being changed, or bind water by physisorption, without its volume being changed significantly in the process.

By the supply of heat, for example by an increase in temperature, the adsorbed water molecules can be removed again. In various configurations, the getter may include or be formed from dried silica gels or zeolites, for example. The getter that includes or is formed from a zeolite can adsorb oxygen and/or water in the pores and channels of the zeolite. Upon the adsorption of water and/or oxygen by dried silica gels and/or zeolites, no harmful substances or substance mixtures can be formed for the underlying layers. Furthermore, the getters composed of dried silica gels and/or zeolite can exhibit no change in volume by the reaction with water and/or oxygen.

In various configurations, the getter particles can have an average diameter of less than approximately 50 µm, for example less than approximately 1 µm. In various configurations, the getter particles can have for example an average diameter that corresponds to approximately 20% of the thickness of the getter layer 46. Getter particles having an average diameter of less than approximately 1 µm, for example in a range of approximately 50 nm to approximately 500 nm, can have the advantage that point forces on the functional layer structure 22, for example, are reduced even in the case of a close packing of the getter particles.

The current distribution element 42 and the overlying supporting structure 38 can optionally be arranged in the optoelectronic component 10 in accordance with FIG. 12.

Figure 13:
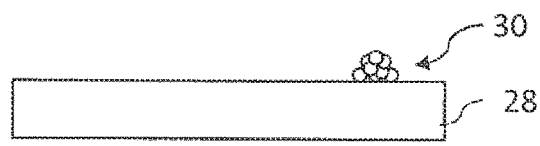
FIG. 13 shows one embodiment of an adhesion layer.

FIG. 13 shows a detail view of the encapsulation layer 28 with a section of the first adhesion layer 30 thereon. The first adhesion layer 30 can be applied to the encapsulation layer 28 for example in the form of many small beads. The small beads have a significantly increased surface area compared with a planar application of the first adhesion layer 30. The first alloy 32 can react with the first metallic material in each surface element of the first adhesion layer 30. A speed of reaction of the first alloy 32 with the metallic materials of the adhesion layers 30, 34 can thus be increased. This can be used for example to increase a processing speed.

Figure 14:
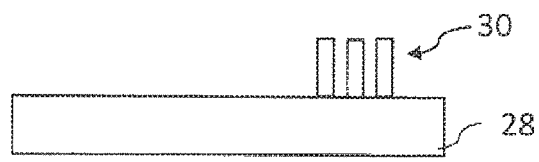
FIG. 14 shows one embodiment of an adhesion layer.

FIG. 14 shows a detail view of the encapsulation layer 28 and the first adhesion layer 30, wherein the first adhesion layer 30 is applied to the encapsulation layer 28 in the form of a plurality of strips parallel to one another. The plurality of strips parallel to one another have a significantly greater surface area than a first adhesion layer 30 correspondingly applied in a planar fashion. The increased surface area can contribute to an accelerated reaction and thus to an accelerated processing speed in the method for producing the optoelectronic component 10.

The disclosure is not restricted to the embodiments indicated. By way of example, the optoelectronic component 10 may include fewer or more layers. By way of example, the optoelectronic component 10 may include a mirror layer, an antireflection layer and/or a coupling-out layer. Furthermore, the embodiments can be combined with one another. By way of example, the optoelectronic components 10 shown in FIGS. 9, 10 and 11 can be produced with the aid of the methods shown with reference to FIGS. 1 to 8. Furthermore, the same alloys and metallic materials can always be used within a single one of the optoelectronic components 10. As an alternative thereto, correspondingly different alloys and/or different metallic materials can be used at different locations within one of the optoelectronic components 10, wherein, if appropriate, different melting points of the alloys can advantageously be utilized in this case.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, the method comprising:
    forming an optoelectronic layer structure having a first adhesion layer, which comprises a first metallic material, above a carrier,
    providing a covering body with a second adhesion layer, which comprises a second metallic material, wherein at least one of the first or the second adhesion layers are delimited in lateral direction by an anti-adhesion layer,
    applying a first alloy to at least one of the two adhesion layers, which is delimited by the anti-adhesion layer, the melting point of said first alloy being so low that the first alloy is liquid, wherein the anti-adhesion layer is not wetted by the first alloy and keeps the first alloy in a region provided therefor,
    coupling the covering body to the optoelectronic layer structure in such a way that both adhesion layers are in direct physical contact with the liquid first alloy, and
    reacting at least part of the liquid first alloy chemically with the metallic materials of the adhesion layers, as a result of which at least one second alloy is formed, which has a higher melting point than the first alloy, wherein the melting point of the second alloy is so high that the second alloy solidifies and fixedly connects the covering body to the optoelectronic layer structure.

2. The method as claimed in claim 1, wherein the melting point of the first alloy is in a range of between −20° C. and 100° C.

3. The method as claimed in claim 2, wherein the first alloy is liquid at room temperature.

4. The method as claimed in claim 1, wherein the first alloy comprises gallium, indium, tin, copper, molybdenum, silver and/or bismuth, and/or wherein the metallic material of at least one of the adhesion layers comprises aluminum, zinc, chromium, copper, molybdenum, silver, gold, nickel, gallium, indium and/or tin.

5. The method as claimed in claim 1, wherein the covering body is formed by a cover plate and a carrier structure, which has the second adhesion layer, and wherein the covering body is coupled to the optoelectronic layer structure via the carrier structure.

6. The method as claimed in claim 5, wherein the cover plate has a third adhesion layer, which comprises a third metallic material, and wherein the carrier structure has a fourth adhesion layer, which comprises a fourth metallic material, on a side of the carrier structure facing away from the second adhesion layer, and wherein the cover plate is coupled to the carrier structure by virtue of the fact that the liquid first alloy is applied to the third and/or the fourth adhesion layer and the carrier structure is coupled to the cover plate in such a way that the third and fourth adhesion layers are in direct physical contact with the first alloy, wherein at least part of the first alloy reacts chemically with the metallic materials of the third and fourth adhesion layers, as a result of which the second or at least one further alloy is formed, which solidifies and which thus fixedly connects the cover plate to the carrier structure.

7. The method as claimed in claim 5, wherein the carrier structure is formed in a frame-shaped fashion, and wherein the first alloy is poured into the frame-shaped carrier structure, such that the carrier structure delimits the first alloy in a lateral direction.

8. The method as claimed in claim 5, wherein the carrier structure is formed in a frame-shaped fashion in such a way that the carrier structure surrounds at least part of the optoelectronic layer structure in a lateral direction.

9. The method as claimed in claim 1, wherein the optoelectronic layer structure has an encapsulation layer, and wherein the first adhesion layer is formed on the encapsulation layer.

10. The method as claimed in claim 1, wherein the optoelectronic layer structure has a carrier structure having the first adhesion layer, and wherein the covering body is coupled to the optoelectronic layer structure via the carrier structure.

11. The method as claimed in claim 10, wherein the optoelectronic layer structure has a fifth adhesion layer, which comprises a fifth metallic material, and wherein the carrier structure has a sixth adhesion layer, which comprises a sixth metallic material, on a side of the carrier structure facing away from the first adhesion layer, and wherein the carrier structure is coupled to the optoelectronic layer structure by virtue of the fact that the liquid first alloy is applied to the fifth and/or the sixth adhesion layer and the carrier structure is coupled to the optoelectronic layer structure in such a way that the fifth and sixth adhesion layers are in direct physical contact with the first alloy, wherein at least part of the first alloy reacts chemically with the metallic materials of the fifth and sixth adhesion layers, as a result of which the second or at least one further alloy is formed, which solidifies and which thus fixedly connects the optoelectronic layer structure to the carrier structure.

12. An optoelectronic component comprising:
   a carrier,
   an optoelectronic layer structure having a first adhesion layer, which comprises a first metallic material, above the carrier,
   a covering body with a second adhesion layer, which comprises a second metallic material, and
   at least one second alloy between the two adhesion layers and in direct physical contact with the two adhesion layers, wherein the covering body is coupled to the optoelectronic layer structure via the two adhesion layers and the second alloy,
   wherein the second alloy is formed in a chemical reaction of a liquid first alloy, the melting point of which is lower than the melting point of the second alloy, and of the metallic materials of the first adhesion layer and the second adhesion layer and is solidified and thus fixedly connects the covering body to the optoelectronic layer structure, and
   wherein at least one of the first and the second adhesion layers are delimited in lateral direction by an anti-adhesion layer, which is not wetted by the first alloy and which keeps the first alloy in a region provided therefor.

13. The optoelectronic component as claimed in claim 12, wherein part of the first alloy is present in a liquid state between the covering body and the optoelectronic layer structure.

14. The optoelectronic component as claimed in claim 12, wherein the melting point of the first alloy is in a range of between −20° C. and 100° C.

15. The optoelectronic component as claimed in claim 14, wherein the first alloy is liquid at room temperature.

16. The optoelectronic component as claimed in claim 12, wherein the first alloy comprises gallium, indium, tin and/or bismuth, and/or wherein the metallic material of at least one of the adhesion layers comprises aluminum, nickel, tin and/or chromium.

17. The optoelectronic component as claimed in claim 12, wherein the covering body has a cover plate and a carrier structure having the second adhesion layer, and wherein the covering body is coupled to the optoelectronic layer structure via the carrier structure.

18. The optoelectronic component as claimed in claim 12, wherein the optoelectronic layer structure has a carrier structure having the first adhesion layer, and wherein the covering body has a cover plate, which is coupled to the optoelectronic layer structure via the carrier structure.

* * * * *